(12) United States Patent
Takahashi et al.

(10) Patent No.: US 8,506,363 B2
(45) Date of Patent: Aug. 13, 2013

(54) SUBSTRATE HOLDER AND SUBSTRATE HOLDING METHOD

(75) Inventors: Tamami Takahashi, Tokyo (JP); Hiroaki Kusa, Tokyo (JP); Masaya Seki, Tokyo (JP)

(73) Assignee: Ebara Corporation, Tokyo (JP)

( * ) Notice: Subject to any disclaimer, the term of this patent is extended or adjusted under 35 U.S.C. 154(b) by 695 days.

(21) Appl. No.: 12/654,561

(22) Filed: Dec. 23, 2009

(65) Prior Publication Data

US 2010/0267317 A1    Oct. 21, 2010

(30) Foreign Application Priority Data

Dec. 25, 2008    (JP) .................................. 2008-330053

(51) Int. Cl.
    *B24B 29/02*    (2006.01)
(52) U.S. Cl.
    USPC ........................................... 451/289; 451/388
(58) Field of Classification Search
    USPC ................................................. 451/388, 289
    See application file for complete search history.

(56) References Cited

U.S. PATENT DOCUMENTS

| | | | | |
|---|---|---|---|---|
| 3,328,022 A | * | 6/1967 | Miller ............................. | 269/21 |
| 5,857,667 A | * | 1/1999 | Lee ................................. | 269/21 |
| 7,326,457 B2 | * | 2/2008 | Yokoyama et al. ............ | 428/118 |
| 7,905,979 B2 | * | 3/2011 | Yokoyama et al. ............ | 156/286 |
| 2003/0102682 A1 | * | 6/2003 | Kurokawa ..................... | 294/64.1 |
| 2003/0181151 A1 | * | 9/2003 | Chao et al. ..................... | 451/287 |
| 2005/0167036 A1 | * | 8/2005 | Yokoyama et al. ............ | 156/230 |
| 2008/0099137 A1 | * | 5/2008 | Yokoyama et al. ............ | 156/285 |

FOREIGN PATENT DOCUMENTS

| | | | |
|---|---|---|---|
| JP | 5-84682 | * | 4/1993 |
| JP | 2000-252187 | | 9/2000 |
| JP | 2006-235018 | | 9/2006 |
| JP | 2006-303112 | | 11/2006 |
| JP | 2006-310697 | | 11/2006 |
| JP | 2007-250601 | | 9/2007 |
| JP | 2008-251749 | | 10/2008 |
| JP | 2008-270580 | | 11/2008 |
| JP | 2008-311466 | | 12/2008 |
| WO | 2006-112531 | | 10/2006 |

OTHER PUBLICATIONS

English language machine translation of JP 5-84682, published Apr. 6, 1993.*

* cited by examiner

*Primary Examiner* — Maurina Rachuba
(74) *Attorney, Agent, or Firm* — Wenderoth, Lind & Ponack, L.L.P.

(57) ABSTRACT

A substrate holder is a mechanism for holding a substrate, to be polished, by vacuum suction. The substrate holder includes a substrate-holding stage having a suction surface for the substrate, and a fluid passage selectively coupled to a vacuum source and a fluid supply source. The suction surface has a plurality of closed sections surrounded by convexities, and the fluid passage includes a plurality of communication passages which are in fluid communication with the plurality of closed segments respectively and independently.

10 Claims, 20 Drawing Sheets

SUBSTRATE HOLDER AND SUBSTRATE HOLDING METHOD

BACKGROUND OF THE INVENTION

1. Field of the Invention

The present invention relates to a substrate holder and a substrate holding method for holding a thin plate-like substrate, such as a semiconductor wafer, by vacuum suction.

2. Description of the Related Art

A substrate holder which holds a surface of a substrate by vacuum suction is typically used as a device for holding a thin plate-like substrate, such as a semiconductor wafer, when processing the substrate. A conventional vacuum suction type substrate holder includes a single vacuum production hole, and holds the substrate by producing vacuum in a space between a suction member and the substrate. Further, the conventional substrate holder is configured to eject a high-pressure fluid from the vacuum production hole in order to release the substrate, which has been attracted once, from the substrate holder.

Functions required for the substrate holder include releasing the substrate without putting stress on the substrate, as well as holding the substrate sufficiently. In order to satisfy such requirements, various types of suction members and various shapes of suction surfaces of the substrate holder have been proposed. Especially, as a semiconductor wafer has a thickness of as thin as 1 mm or less and is made of brittle material, careful treatment is necessary so as not to damage the semiconductor wafer when releasing it.

FIG. 1 is a cross-sectional view showing a conventional substrate holder, and FIG. 2 is a top plan view showing the substrate holder in FIG. 1 in a state of not holding the substrate. The substrate holder has a suction stage 200 having a flat and circular top surface and a suction pad 201 attached to the top surface of the suction stage 200. The suction stage 200 is mounted on a rotatable shaft 202, so that the suction stage 200 and the shaft 202 rotate in unison. The shaft 202 has a hollow structure, and a tube 203 extends through the shaft 202. The tube 203 is coupled to the suction stage 200 in an air-tight manner by an O-ring 204. The suction stage 200 is secured to the shaft 202 by four screws 205.

The suction pad 201 is composed of a plurality of pad pieces arranged along a plurality of concentric circles (virtual circles). An outermost pad piece 201a having a closed ring shape is arranged along an outermost periphery of the top surface of the suction stage 200. A single vacuum production hole 206 is formed at a center of the suction stage 200. The vacuum production hole 206 communicates with a recess formed between the pad pieces of the suction pad 201 and also communicates with the tube 203. When the vacuum production hole 206 is evacuated with the substrate W on the suction pad 201, the outermost pad piece 201a of the suction pad 201 functions as a sealing member, whereby negative pressure is created between the substrate W and the suction stage 200 to attract the substrate W.

When releasing the substrate W, fluid communication between the vacuum production hole 206 and a fluid supply source is established via the tube 203. A fluid, such as nitrogen gas, spouts from the vacuum production hole 206 to thereby release the substrate W. However, once one fluid path running from the vacuum production hole 206 to the periphery of the substrate holder is formed during supply of the fluid, most of the fluid supplied is discharged to the exterior through the fluid path. Consequently, it becomes difficult to separate the substrate W from portions of the suction pad 201 other than the fluid path. Especially, in a case of using foam material for the suction pad 201, a portion thereof where the suction pad 201 is in contact with the substrate W microscopically acts as a suction cup, which makes it difficult to release the substrate W from the suction pad 201.

FIG. 3 is a cross-sectional view showing another example of a conventional substrate holder. FIG. 4 is a top plan view of the substrate holder in FIG. 3 in a state of not holding the substrate. As shown in FIG. 4, the top surface of the suction stage 200 has grooves 208 extending radially as illustrated by dashed lines in FIG. 4. These grooves 208 are in fluid communication with the vacuum production hole 206 provided in the center of the suction stage 200. The suction pad 201 is attached to the top surface of the suction stage 200 so as to cover the grooves 208. The suction pad 201 has a plurality of through-holes 209 arranged along the grooves 208, and the grooves 208 and the through-holes 209 communicate with each other.

Even in the case of providing the plurality of through-holes 209 as shown in FIG. 4, once one fluid path is formed between the substrate W and the suction pad 201 when releasing the substrate W, the fluid from all of the through-holes 209 converges on this fluid path. As a result, the same problem arises. Further, once one fluid path is formed, pressure of the fluid supply source is lowered. Consequently, the action of separating the substrate from portions other than the fluid path is weakened.

SUMMARY OF THE INVENTION

The present invention has been made in view of the above drawbacks. It is therefore an object of the present invention to provide a substrate holder and a substrate holding method capable of releasing a substrate easily.

In order to achieve the above object, according to one aspect of the present invention, there is provided a substrate holder for holding a substrate by vacuum suction. The substrate holder includes: a substrate-holding stage having a suction surface for the substrate; and a fluid passage selectively coupled to a vacuum source and a fluid supply source, wherein the suction surface has a plurality of closed sections surrounded by convexities, and wherein the fluid passage includes a plurality of communication passages which are in fluid communication with the plurality of closed segments respectively and independently.

In a preferred aspect of the present invention, the substrate-holding stage includes a plurality of support members having a height equal to that of the convexities, and the plurality of support members are arranged in the plurality of closed sections.

In a preferred aspect of the present invention, the plurality of communication passages branch off from a single main passage, and flow-rate regulators for regulating a flow rate of fluid are provided in the plurality of communication passages.

In a preferred aspect of the present invention, the flow-rate regulators are orifices that provide resistance to flow of the fluid.

In a preferred aspect of the present invention, the substrate-holding stage has a suction pad that is brought into contact with the substrate, and the convexities are formed by the suction pad.

In a preferred aspect of the present invention, the substrate-holding stage has a sheet suction pad that is brought into contact with the substrate, and the convexities and the closed sections are formed on a surface of the suction pad.

In a preferred aspect of the present invention, the convexities are O-rings.

In a preferred aspect of the present invention, the suction surface is smaller than the substrate.

Another aspect of the present invention is to provide a method of holding a substrate. The method includes: holding the substrate via vacuum suction by a substrate holder; performing a first process on the substrate while holding the substrate; after the first process, lowering a degree of vacuum of the vacuum suction; performing a second process on the substrate while holding the substrate with the lowered degree of vacuum; and after the second process, releasing the substrate from the substrate holder by blowing a fluid to the substrate.

In a preferred aspect of the present invention, an external force acting on the substrate during the second process is smaller than an external force acting on the substrate during the first process.

In a preferred aspect of the present invention, the fluid is one of air, nitrogen gas, and water.

According to the present invention, the fluid is supplied to the closed sections that are isolated from each other, respectively and independently. Therefore, releasing actions can be obtained in each of the closed sections. As a result, the substrate can be separated from the suction surface reliably. Further, according to the present invention, the degree of vacuum of the vacuum suction is lowered before releasing the substrate. Therefore, the substrate can be released from the suction surface reliably.

DETAILED DESCRIPTION OF THE PREFERRED EMBODIMENTS

Embodiments of the present invention will be described below with reference to the drawings.

Figure 1:
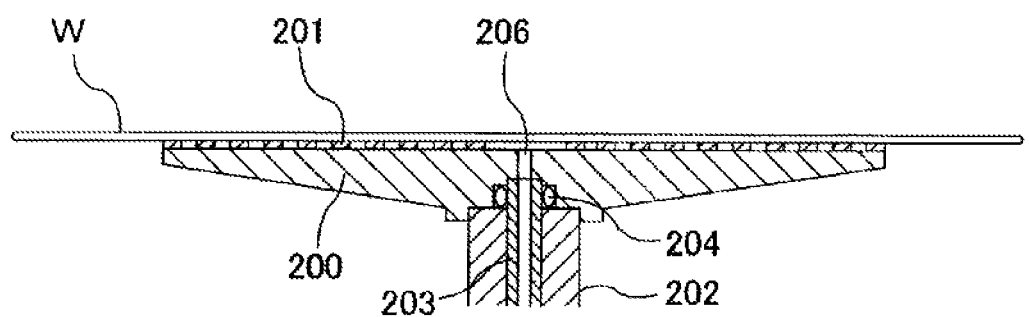
FIG. 1 is a cross-sectional view showing a conventional substrate holder.
Figure 2:
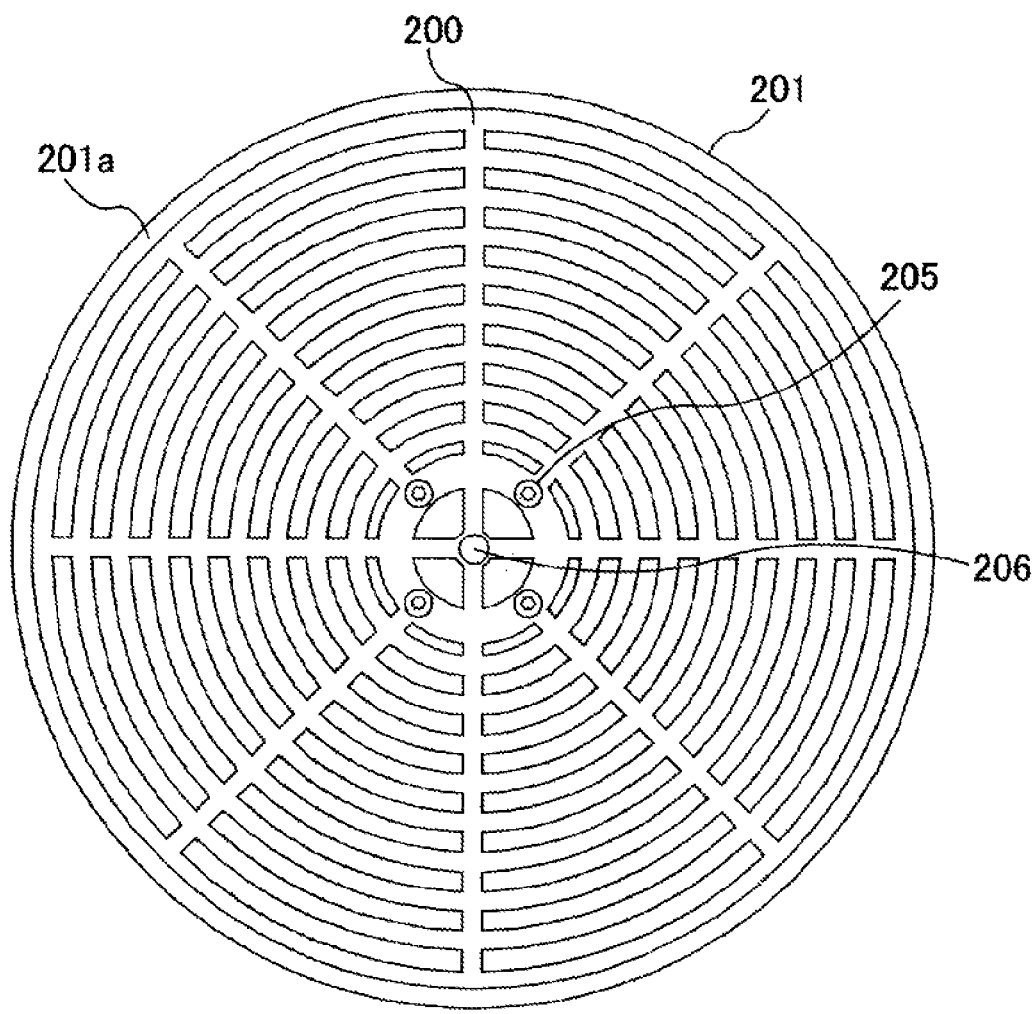
FIG. 2 is a top plan view showing the substrate holder in FIG. 1 in a state of not holding a substrate.
Figure 3:
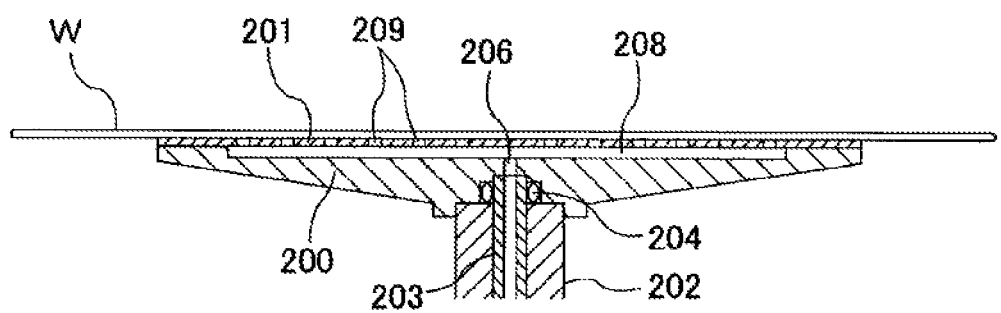
FIG. 3 is a cross-sectional view showing another example of a conventional substrate holder.
Figure 4:
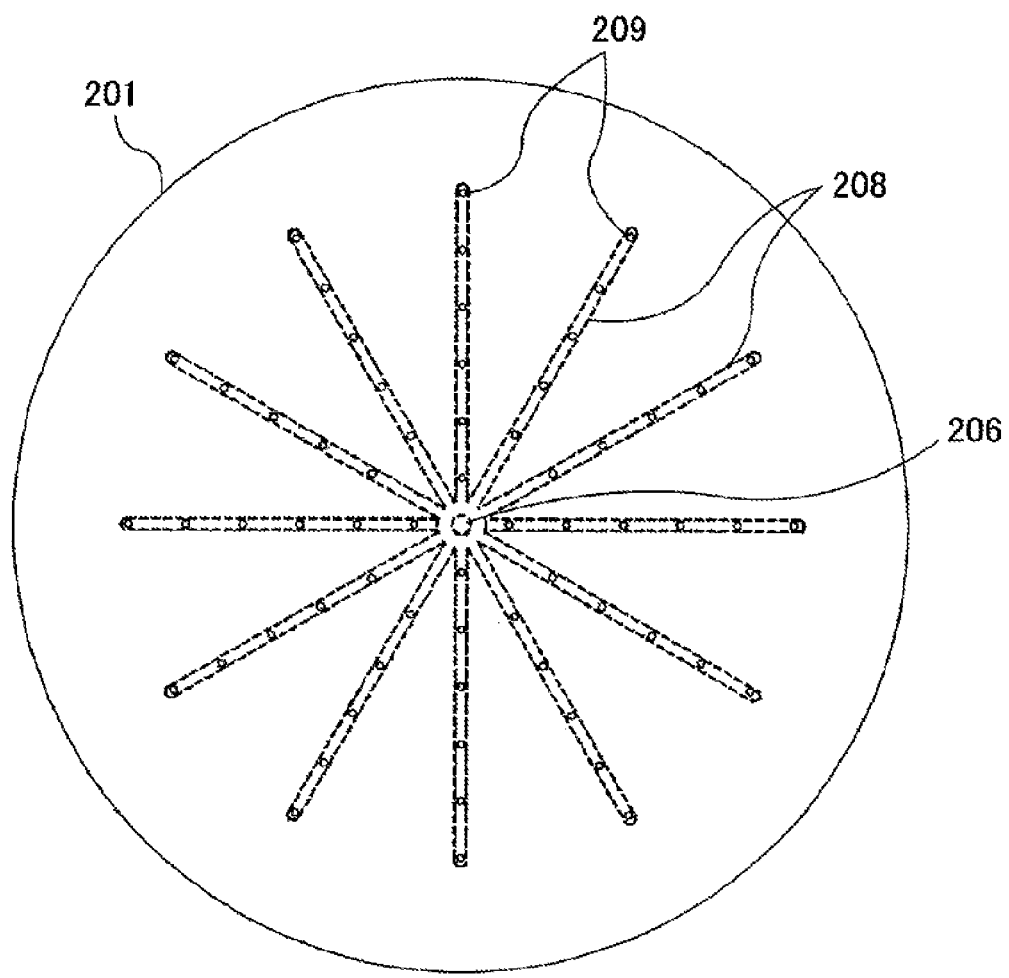
FIG. 4 is a top plan view showing the substrate holder in FIG. 3 in a state of not holding a substrate.
Figure 5:
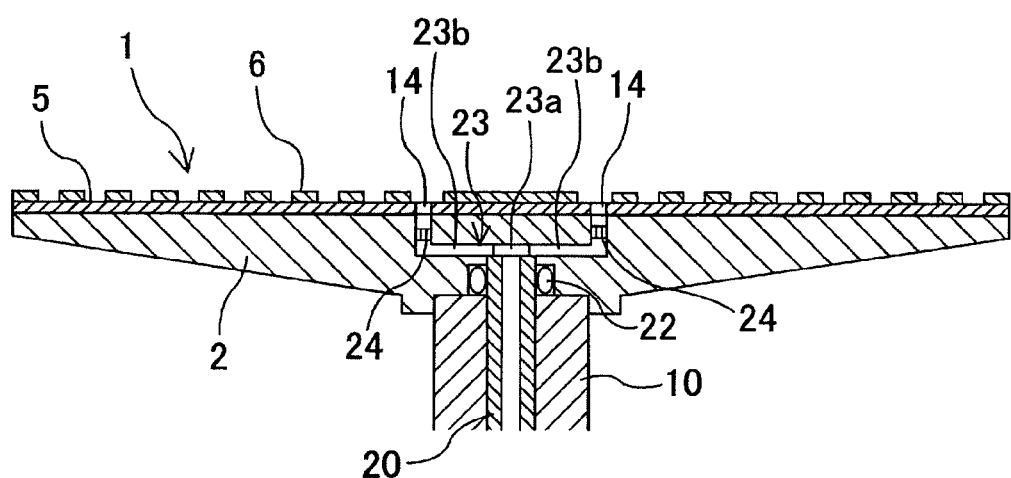
FIG. 5 is a cross-sectional view showing a substrate holder according to an embodiment of the present invention.
Figure 6:
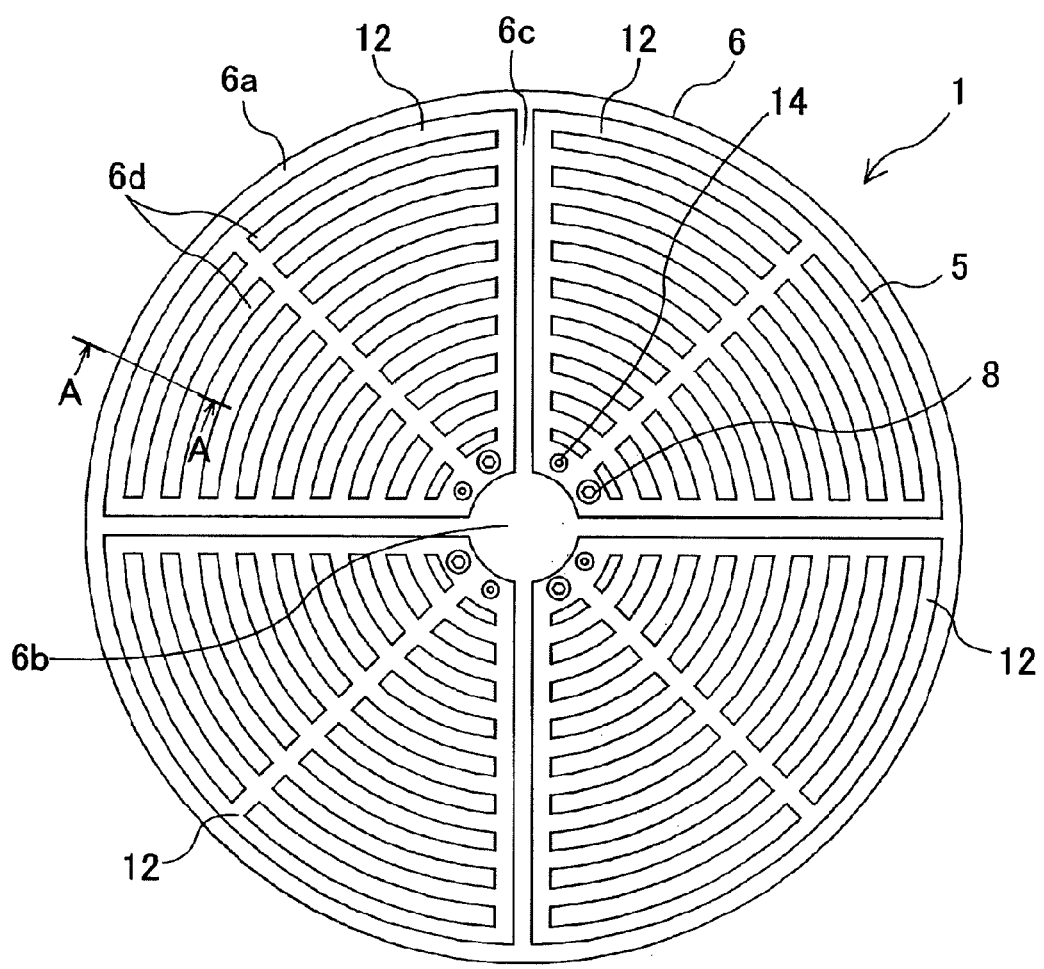
FIG. 6 is a top plan view of the substrate holder shown in FIG. 5.

FIG. 5 is a cross-sectional view showing a substrate holder according to an embodiment of the present invention, and FIG. 6 is a top plan view of the substrate holder. The substrate holder includes a substrate-holding stage 1 having a suction surface for a substrate. The substrate-holding stage 1 has a dish-shaped suction stage 2 having a flat top surface, a circular holding plate 5 provided on the top surface of the suction stage 2 and having a flat top surface, and a suction pad 6 attached to the top surface of the holding plate 5. The suction stage 2 is secured to a rotational shaft 10, so that the suction stage 2 and the rotational shaft 10 can rotate in unison. The suction stage 2 is fixed to the rotational shaft 10 by four screws 8.

The holding plate 5 is made of rigid resin, such as PEEK (polyetheretherketone). The suction pad 6 is made of foamed polyurethane or silicon rubber. Flexible material is selected for the suction pad 6 so as not to damage a substrate, such as a semiconductor wafer, during vacuum suction. The suction pad 6 has a sealing ability and therefore functions as a sealing member that is brought into contact with a rear surface of the substrate. The suction pad 6 is a thin sheet having a thickness of several hundreds of micrometers. An adhesive layer (which will be described later) is formed on a lower surface of the suction pad 6. The suction pad 6 is attached to the holding plate 5 via the adhesive layer.

Figure 7:
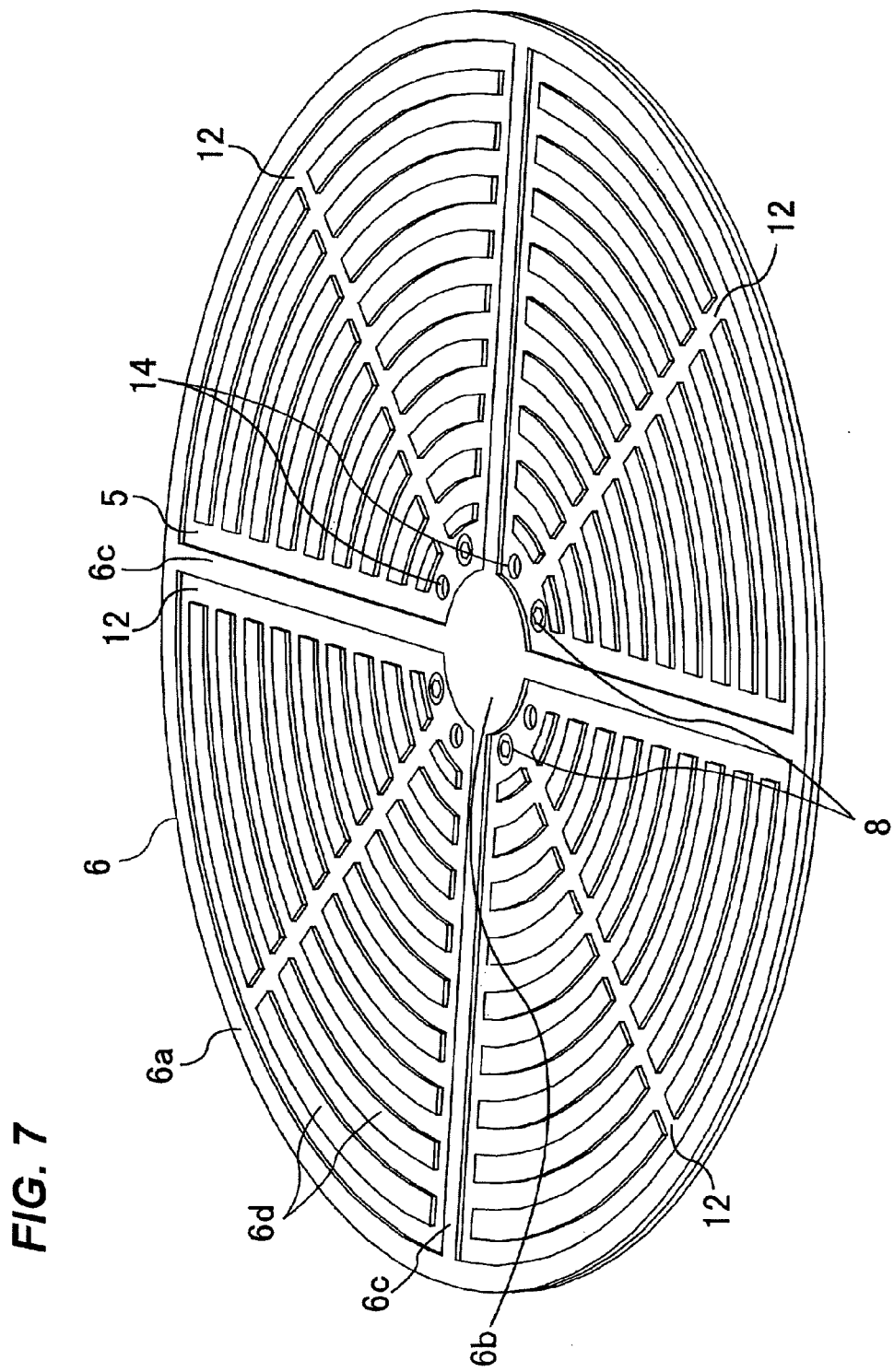
FIG. 7 is a perspective view showing a substrate-holding stage.

FIG. 7 is a perspective view showing the suction pad and the holding plate. As shown in FIG. 6 and FIG. 7, the suction pad 6 includes a circumferential portion 6a extending along an outermost periphery of the holding plate 5, a central circular portion 6b located at a center of the holding plate 5, and four linking portions 6c that link the circumferential portion 6a and the central circular portion 6b to each other. The circumferential portion 6a has a closed ring shape, and the linking portions 6c extend radially. Four fan-shaped closed sections 12 are defined by the circumferential portion 6a, the central circular portion 6b, and the linking portions 6c. These closed sections 12 provide independent closed spaces when the substrate is placed on the suction pad 6.

The suction pad 6 further includes a plurality of pad pieces (support members) 6d disposed in the respective closed sections 12. These pad pieces 6d are separated from each other and arranged along a plurality of concentric circles (virtual circles). The pad pieces 6d have the same height as the circumferential portion 6a, the central circular portion 6b, and the linking portions 6c. In the present embodiment, each of the pad pieces 6d has a circular arc shape. By attaching the suction pad 6 to the top surface of the holding plate 5, convexities and concavities are formed on the suction surface. Specifically, the suction pad 6 provides the convexities, and regions where the suction pad 6 is not attached provide the concavities.

The holding plate 5 has four vacuum production holes (through-holes) 14 and four threaded holes (not shown) located in the four closed sections 12. These vacuum production holes 14 and threaded holes are located near the central circular portion 6*b* of the suction pad 6. The suction stage 2 has threaded holes (not shown) at locations corresponding to the threaded holes of the holding plate 5. The rotational shaft 10 has female screws (not shown) at locations corresponding to the threaded holes of the suction stage 2. The above-mentioned screws 8 are inserted into these threaded holes and female screws, whereby the suction stage 2 is secured to the rotational shaft 10.

The rotational shaft 10 has a hollow structure through which a tube 20 extends. The tube 20 and the suction stage 2 are coupled to each other in an air-tight manner by a sealing member 22, such as an O-ring. A connection passage 23 for providing fluid communication between the vacuum production holes 14 and the tube 20 is provided in the suction stage 2. This connection passage 23 is composed of one main passage 23*a* and four branch passages 23*b* diverging from the main passage 23*a*. These four branch passages 23*b* are in fluid communication with the vacuum production holes 14, respectively. As described above, the four vacuum production holes 14 are in fluid communication with the four closed sections 12 respectively and independently. Orifices (fluid resistors) 24 that provide resistance to flow of a fluid are provided in the four branch passages 23*b*, respectively. Each orifice 24 is a flow-rate regulator for regulating a flow rate of a fluid flowing through the branch passage 23*b*. In the present embodiment, the vacuum production holes 14 and the connection passage 23 constitute a fluid passage, and the vacuum production holes 14 and the branch passages 23*b* constitute communication passages.

A vacuum source, configured to produce a vacuum for attracting the substrate, and a fluid supply source, configured to supply a fluid (e.g., N₂ gas) for releasing the substrate, are selectively coupled to the tube 20. Specifically, when attracting the substrate, the vacuum source is coupled to the tube 20, and when releasing the substrate from the substrate holder, the fluid supply source is coupled to the tube 20.

Figure 8:
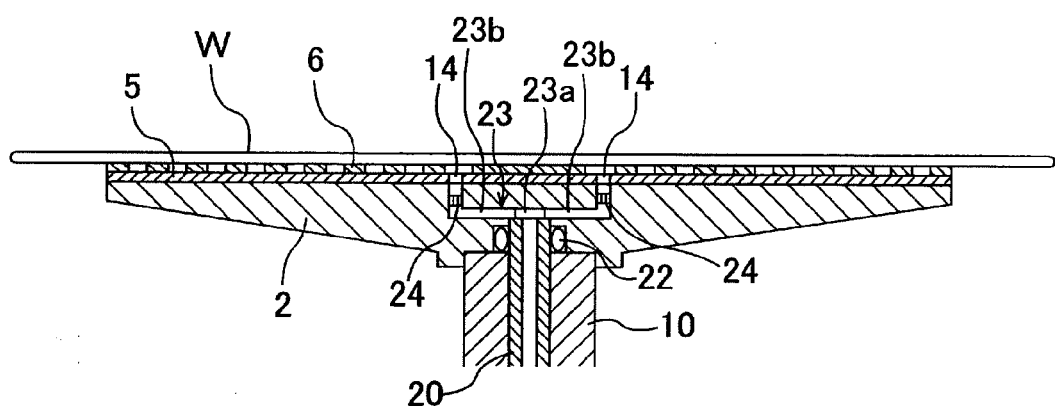
FIG. 8 is a cross-sectional view showing the substrate holder with a substrate, such as a semiconductor wafer, placed on a top surface of the substrate holder according to the embodiment of the present invention.

FIG. 8 is a cross-sectional view showing the substrate holder with a substrate, such as a semiconductor wafer, placed on a top surface of the substrate holder according to the embodiment of the present invention. When a vacuum is formed in the four vacuum production holes 14 with the substrate W placed on the suction surface of the substrate holder, the convexities, constituted by the circumferential portion 6*a*, the central circular portion 6*b*, and the linking portions 6*c*, function as a sealing member and the vacuum is formed in the concavities where the suction pad 6 is not attached. The substrate W is thus held on the suction surface of the substrate holder via the vacuum suction. The suction surface in its entirety is of a circular shape and is smaller in size than the substrate W. This configuration makes it easier to polish a periphery (a bevel portion and near-edge portions) of the substrate W held on the suction surface.

The pad pieces 6*d* of the suction pad 6 function as support members for maintaining flatness of the substrate W itself when the substrate W is held. Without the pad pieces 6*d*, the thin plate-shaped substrate W would be dented and undulation would be created in the surface of the substrate W in its entirety. As the plurality of pad pieces 6*d* are provided, the substrate holder can hold the substrate W while keeping the surface of the substrate W flat.

When releasing the substrate W from the substrate holder, the fluid supply source supplies a fluid (e.g., nitrogen gas, air, or water) to the connection passage 23 of the suction stage 2 to cause the fluid to spout from the vacuum production holes 14 of the holding plate 5. According to the substrate holder of the present embodiment, the suction surface is divided into the plural closed sections 12 and the fluid is supplied to the respective closed sections 12 through the communication passages provided independently of each other. Therefore, plural portions of the substrate W can be separated independently. In order to release the substrate W more reliably, the orifices 24 are provided in the four branch passages 23*b* that branch off from the single main passage 23*a*. These orifices 24 can reduce pressure drop in upstream regions of the orifices 24. Therefore, for example, even if the fluid escapes from one closed section to the exterior, pressure of the fluid supplied to the other closed sections can be maintained. Thus, the substrate W can be separated reliably in all of the closed sections.

While the four closed sections 12 are provided in this embodiment, the present invention is not limited to this embodiment so long as at least two closed sections are provided. In any modified embodiment, the linking portions 6*c*, the vacuum production holes 14, the branch passages 23*b*, and the orifices 24 are provided according to the number of closed sections 12.

Figure 9:
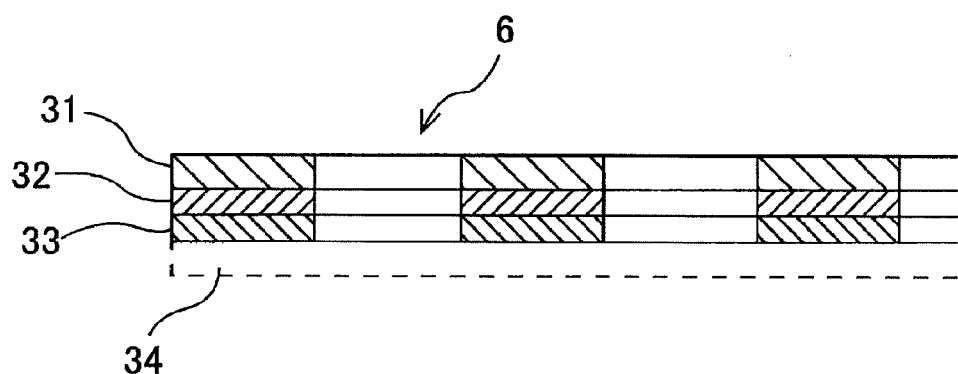
FIG. 9 is a cross-sectional view taken along line A-A in FIG. 6.

FIG. 9 is a cross-sectional view taken along line A-A in FIG. 6 and shows a cross section across the thickness of the suction pad 6. The suction pad 6 includes a flexible layer 31 which is brought into contact with the substrate, an adhesive layer 33 contacting the holding plate 5, and a base layer 32 sandwiched between the flexible layer 31 and the adhesive layer 33. The suction pad 6 is prepared with a removable paper 34 attached to a lower surface of the adhesive layer 33 as illustrated by a dashed line. Just before the suction pad 6 is attached to the holding plate 5, the removable paper 34 is removed from the lower surface of the adhesive layer 33 to expose the adhesive layer 33. In this state, the suction pad 6 is attached to the top surface of the holding plate 5. The suction pad 6 is manufactured such that the adhesive layer 33 is cut completely in a pattern as shown in FIG. 6 while the removal paper 34 is not completely cut. The suction pad 6 is put on the market in such a state that the circumferential portion 6*a*, the central circular portion 6*b*, the linking portions 6*c*, and the pad pieces 6*d* are connected to each other by the removal paper 34. Typically, the suction pad 6 is fabricated into the shape as shown in FIG. 6 using Thomson die.

The suction pad 6 is made of elastic material, such as foamed polyurethane or silicon rubber, as described above. If necessary, Teflon coating may be applied to the top surface (the surface contacting the substrate W) of the suction pad 6. This is to enable the rear surface of the substrate W to be separated more easily from the top surface of the suction pad 6. On the other hand, in the case where Teflon coating is applied to the suction pad 6, the sealing performance during the vacuum suction may be weakened. Therefore, it is preferable to apply the coating only to the pad pieces 6*d* of the suction pad 6, not to the circumferential portion 6*a*, the central circular portion 6*b*, and the linking portions 6*c* which function as sealing members.

Figure 10:
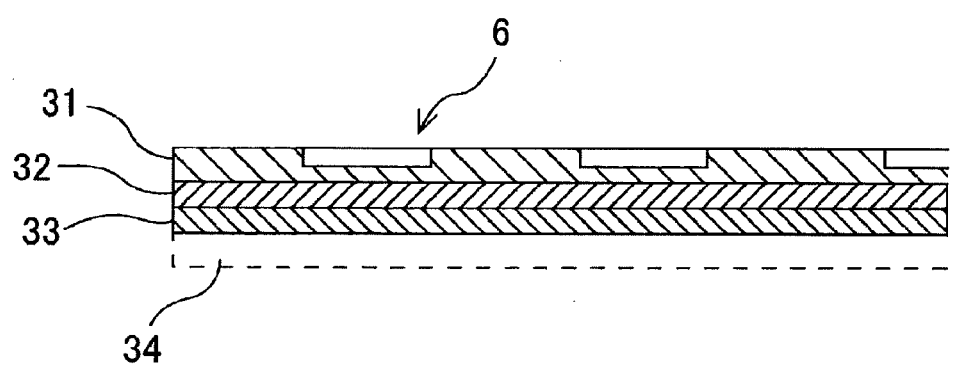
FIG. 10 is a cross-sectional view showing a suction pad of the substrate holder according to another embodiment of the present invention.

FIG. 10 is a cross-sectional view showing the suction pad of the substrate holder according to another embodiment of the present invention. Structures of the present embodiment which will not be described particularly are identical to those of the above-described embodiment, and repetitive descriptions thereof are omitted.

In this embodiment, concavities are formed on the top surface of the flexible layer 31 of the suction pad 6. These concavities correspond to the concavities (including the closed sections 12) in the above-described embodiment, and portions where the concavities are not formed correspond to the convexities, i.e., the suction pad, in the above-described embodiment. These concavities and convexities, formed on the surface of the flexible layer 31, have the same effect as that in the previous embodiment. Further, according to the present embodiment, operation of attaching the suction pad 6 only involves attaching one sheet-like suction pad 6 to the holding plate 5, and operation of removing the suction pad 6 only involves removing one sheet-like suction pad 6. Therefore, replacement of the suction pad 6 can be completed in a short time. The concavities on the surface of the flexible layer 31 may be formed by cutting, or may be formed more easily using pressure forming technique, such as heat press.

Figure 11:
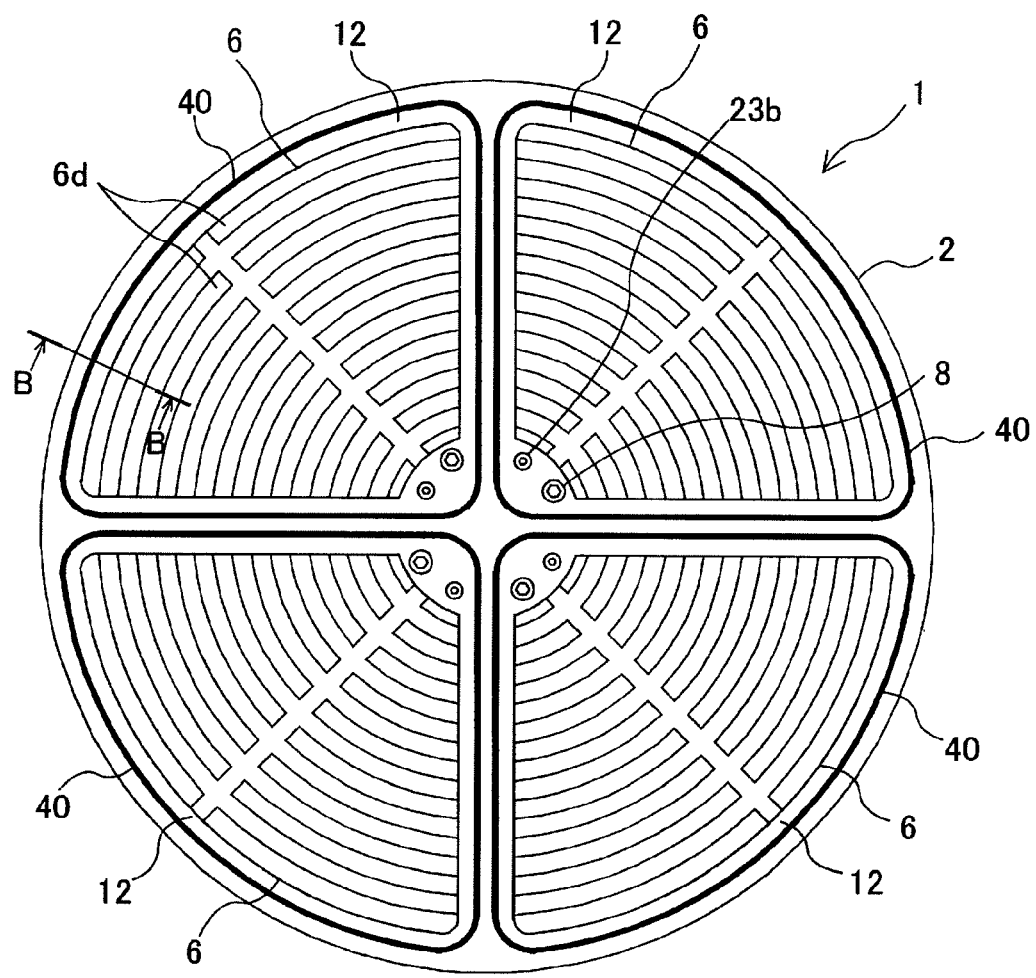
FIG. 11 is a top plan view showing the substrate holder according to still another embodiment of the present invention.
Figure 12:
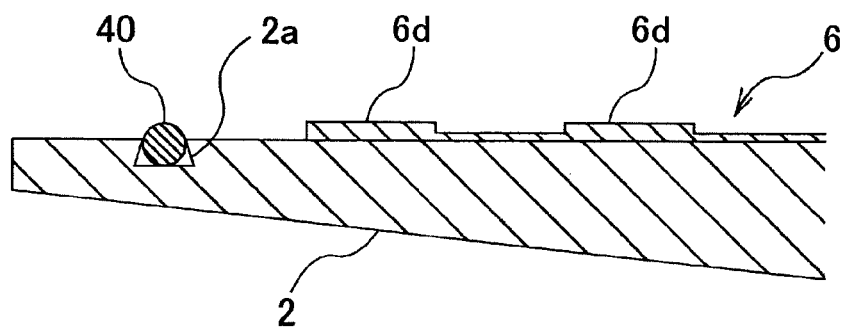
FIG. 12 is a cross-sectional view taken along line B-B in FIG. 11.

FIG. 11 is a top plan view showing the substrate holder according to still another embodiment of the present invention. FIG. 12 is a cross-sectional view taken along line B-B in FIG. 11. Structures of the present embodiment which will not be described particularly are identical to those of the above-described embodiment, and repetitive descriptions thereof are omitted.

As shown in FIG. 11, four O-rings 40 are provided on the top surface of the suction stage 2 and the suction surface is divided into four closed sections 12 by the O-rings 40. The O-rings 40 correspond to the convexities constituted by the circumferential portion 6a, the central circular portion 6b, and the linking portions 6c in the above-described embodiment. As shown in FIG. 12, the O-rings 40 are fitted into grooves 2a formed on the suction stage 2.

At least one sheet-shaped suction pad 6 is disposed in each of the four closed sections 12. The suction pad 6 is made of foamed polyurethane, silicon rubber, or the like. The suction pad 6 has convex portions (support members) 6d formed on the surface thereof. The convex portions 6d have substantially the same height as the O-ring 40. The convex portions 6d correspond to the pad pieces in the above-described embodiment. In the present embodiment, the holding plate is not provided between the suction pad 6 and the suction stage 2. In this embodiment, the fluid passage is constituted by the connection passage 23, and the communication passages are constituted by the branch passages 23b.

According to the present embodiment, the O-rings 40, defining the closed segments 12, can improve the sealing performance. Further, because replacement of the O-rings 40 is easy, the O-rings 40 and the suction pad 6, which are consumable parts of the substrate holder, can be replaced in a short time. Instead of the suction pad 6 attached to the inside of the O-ring 40, rubber string(s) may be attached to groove(s) formed on the suction stage 2, like the O-ring 40.

Figure 13:
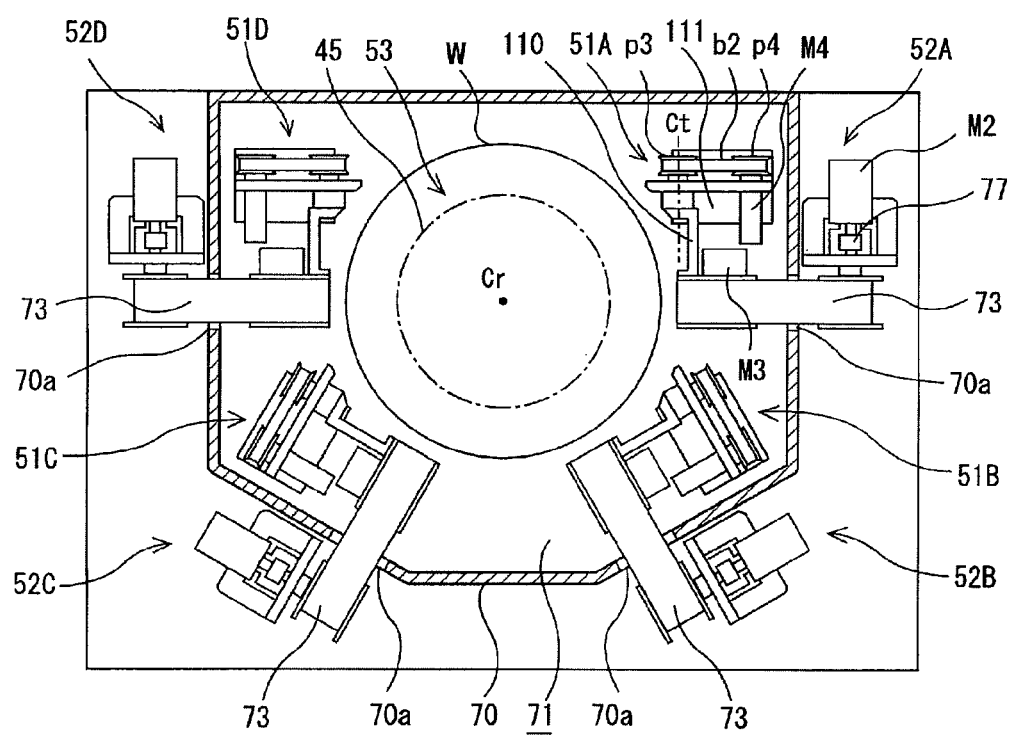
FIG. 13 is a plan view showing a polishing apparatus including the substrate holder according to the above-described embodiment.
Figure 14:
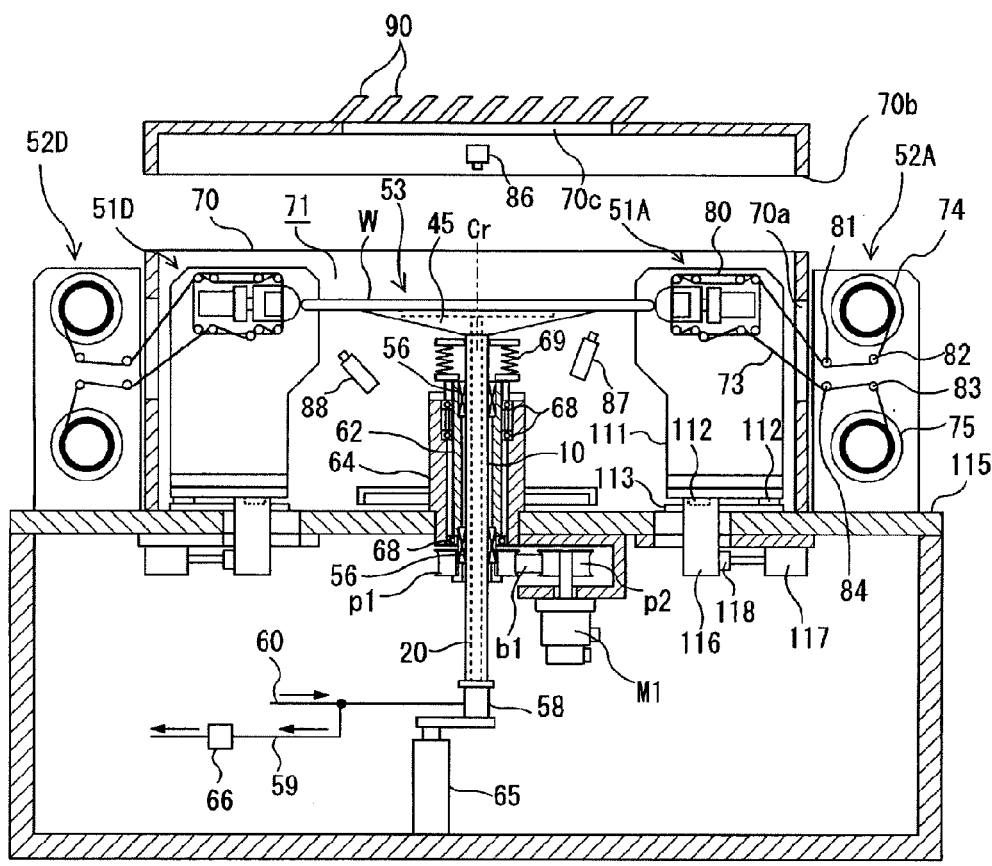
FIG. 14 is a vertical cross-sectional view of the polishing apparatus shown in FIG. 13.

Next, a substrate holding method using the substrate holder according to the embodiment of the present invention will be described. FIG. 13 is a plan view showing a polishing apparatus including the substrate holder according to the above-described embodiment, and FIG. 14 is a vertical cross-sectional view of the polishing apparatus shown in FIG. 13. This polishing apparatus is preferably used as a bevel polishing apparatus for polishing a bevel portion of the substrate.

As shown in FIG. 13 and FIG. 14, the polishing apparatus includes a rotary holding mechanism 53 configured to hold a substrate W (i.e., a workpiece to be polished) horizontally. This rotary holding mechanism 53 is located in the center of the polishing apparatus. The rotary holding mechanism 53 includes the substrate holder according to any one of the above-discussed embodiments. Specifically, the rotary holding mechanism 53 has a substrate holder 45 according to the embodiment of the present invention, the rotational shaft 10 coupled to a central portion of the substrate holder 45, and a motor M1 for rotating the rotational shaft 10. The substrate W is placed onto the substrate holder 45 by transfer arms of a transfer device (which will be described later) such that a center of the substrate W is aligned with a central axis of the rotational shaft 10.

The rotational shaft 10 is supported by ball spline bearings (linear motion bearings) 56 which are configured to allow the rotational shaft 10 to move freely in a vertical direction. The tube (communication line) 20 extending through the rotational shaft 10 is coupled to a vacuum line 59, serving as a vacuum source, via a rotary joint 58 provided on a lower end of the rotational shaft 10. The tube 20 is also coupled to a nitrogen-gas supply line 60, serving as a fluid supply source, for releasing a processed substrate W from the substrate holder 45. A vacuum regulator 66 is provided on the vacuum line 59, so that a degree of vacuum is controlled by the vacuum regulator 66 according to signals from a controller (not shown). By selectively coupling the vacuum line 59 and the nitrogen-gas supply line 60 to the tube 20, the substrate W is attracted to the top surface of the substrate holder 45 by the vacuum suction and released from the top surface of the substrate holder 45.

The rotational shaft 10 is rotated by the motor M1 through a pulley p1 coupled to the rotational shaft 10, a pulley p2 secured to a rotational shaft of the motor M1, and a belt b1 riding on these pulleys p1 and p2. The rotational shaft of the motor M1 extends parallel to the rotational shaft 10. With these structures, the substrate W, held on the upper surface of the substrate holder 45, is rotated by the motor M1.

The ball spline bearing 56 is a bearing that allows the rotational shaft 10 to move freely in its longitudinal direction. The ball spline bearings 56 are secured to a casing 62. Therefore, the rotational shaft 10 is allowed to move linearly up and down with respect to the casing 62, and the rotational shaft 10 and the casing 62 rotate in unison. The rotational shaft 10 is coupled to an air cylinder (elevating mechanism) 65, so that the rotational shaft 10 and the substrate holder 45 can be elevated and lowered by the air cylinder 65.

A casing 64 is provided so as to surround the casing 62. The casing 62 and the casing 64 are arranged concentrically. Radial bearings 68 are provided between the casing 62 and the casing 64, and the casing 62 is rotatably supported by the bearings 68. With these structures, the rotary holding mechanism 53 can rotate the substrate W about its central axis Cr and can elevate and lower the substrate W along the central axis Cr.

As shown in FIG. 13, four polishing head assemblies (polishing units) 51A, 51B, 51C, and 51D are arranged around the substrate W held by the rotary holding mechanism 53. Tape supplying and recovering mechanisms 52A, 52B, 52C, and 52D are provided radially outwardly of the polishing head assemblies 51A, 51B, 51C, and 51D, respectively. The polishing head assemblies 51A, 51B, 51C, and MD are isolated from the tape supplying and recovering mechanisms 52A, 52B, 52C, and 52D by a partition 70. An interior space of the partition 70 provides a polishing room 71. The four polishing head assemblies 51A, 51B, 51C, and 51D and the substrate holder 45 are located in the polishing room 71. On the other hand, the tape supplying and recovering mechanisms 52A, 52B, 52C, and 52D are located outside the partition 70 (i.e., outside the polishing room 71). The polishing head assemblies 51A, 51B, 51C, and 51D have the same structure, and the tape supplying and recovering mechanisms 52A, 52B, 52C, and 52D have the same structure. Thus, the polishing head assembly 51A and the tape supplying and recovering mechanism 52A will be described in detail below.

The tape supplying and recovering mechanism 52A includes a supply reel 74 for supplying a polishing tape (i.e., a polishing tool) 73 to the polishing head assembly 51A, and a recovery reel 75 for recovering the polishing tape 73 that has been used in polishing of the substrate W. The supply reel 74 is arranged above the recovery reel 75. Motors M2 are coupled respectively to the supply reel 74 and the recovery reel 75 via couplings 77 (FIG. 13 shows only the coupling 77 and the motor M2 coupled to the supply reel 74). Each motor M2 is configured to exert a constant torque in a predetermined rotational direction so as to apply a predetermined tension to the polishing tape 73.

The polishing tape 73 is a long tape-shaped polishing tool, and one of surfaces thereof provides a polishing surface. The supply reel 74 is mounted on the tape supplying and recovering mechanism 52A, with the polishing tape 73 wound on the supply reel 74. Both sides of the wound polishing tape 73 are supported by reel plates so as not to collapse. One end of the polishing tape 73 is attached to the recovery reel 75, so that the recovery reel 75 takes up the polishing tape 73, supplied to the polishing head assembly 51A, to thereby recover the polishing tape 73. The polishing head assembly 51A has a polishing head 80 for pressing the polishing tape 73, supplied from the tape supplying and recovering mechanism 52A, against a periphery of the substrate W. The polishing tape 73 is supplied to the polishing head 80 such that the polishing surface of the polishing tape 73 faces the substrate W.

The tape supplying and recovering mechanism 52A has plural guide rollers 81, 82, 83, and 84. The polishing tape 73, to be supplied to and recovered from the polishing head assembly 51A, is guided by these guide rollers 81, 82, 83, and 84. The polishing tape 73 is supplied to the polishing head 80 from the supply reel 74 of the tape supplying and recovering mechanism 52A through an opening 70a formed in the partition 70, and the used polishing tape 73 is recovered by the recovery reel 75 through the opening 70a.

As shown in FIG. 14, an upper supply nozzle 86 is provided above the substrate W. This upper supply nozzle 86 is configured to supply a polishing liquid onto a center of an upper surface of the substrate W held by the rotary holding mechanism 53 during polishing of the substrate W. Lower supply nozzles 87 are provided for supplying a polishing liquid onto a boundary between the rear surface of the substrate W and the substrate holder 45 of the rotary holding mechanism 53 (i.e., onto a periphery of the substrate holder 45). Typically, pure water is used as the polishing liquid. Alternatively, ammonia may be used in a case where silica is used as abrasive grains of the polishing tape 73.

The polishing apparatus further includes cleaning nozzles 88 each for cleaning the polishing head 80 after the polishing process. Each of the cleaning nozzles 88 is configured to eject cleaning water toward the polishing head 80 after the polished substrate W is elevated by the rotary holding mechanism 53 to thereby clean the polishing head 80 used in the polishing process.

In order to isolate devices, including the ball spline bearings 56 and the radial bearings 68, from the polishing room 71 when the rotational shaft 10 is elevated and lowered relative to the casing 62, the rotational shaft 10 and an upper end of the casing 62 are coupled to each other by a bellows 69 that is extensible and contractible in a vertical direction, as shown in FIG. 14. FIG. 14 shows a state in which the rotational shaft 10 is lowered and the substrate holder 45 is in a polishing position. After the polishing process, the air cylinder 65 elevates the substrate W, together with the substrate holder 45 and the rotational shaft 10, to a transport position, where the substrate W is released from the substrate holder 45.

The partition 70 has an entrance 70b through which the substrate W is transported into and removed from the polishing room 71. The entrance 70b is an opening in a shape of horizontally extending notch. Therefore, the substrate W, held by the transfer arms of the transfer device, can travel across the polishing room 71 through the entrance 70b with an attitude of the substrate W maintained horizontally. An upper surface of the partition 70 has an opening 70c and louvers 90, and a lower surface of the partition 70 has a gas-discharge opening (not shown in the drawing). During the polishing process, the entrance 70b is closed by a non-illustrated shutter. Therefore, as a fan machine (not shown in the drawing) is driven to evacuate the polishing room 71 through the gas-discharge opening, downward flow of clean air is formed in the polishing room 71. Because the polishing process is performed under such conditions, the polishing liquid is prevented from being scattered upwardly. Therefore, the polishing process can be performed while an upper space of the polishing room 71 is kept clean.

Figure 15:
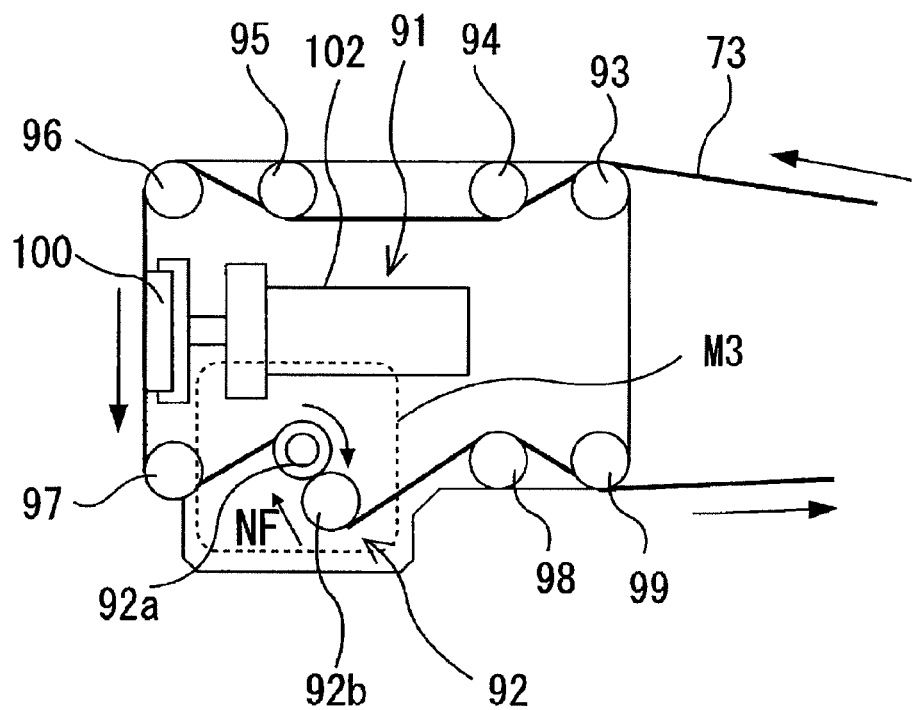
FIG. 15 is an enlarged view of a polishing head shown in FIG. 13.

FIG. 15 is an enlarged view of the polishing head 80. As shown in FIG. 15, the polishing head 80 has a pressing mechanism 91 configured to exert pressure on a rear surface of the polishing tape 73 to press the polishing surface of the polishing tape 73 against the substrate W at a predetermined force. The polishing head 80 further has a tape-sending mechanism 92 configured to send the polishing tape 73 from the supply reel 74 to the recovery reel 75. The polishing head 80 has plural guide rollers 93, 94, 95, 96, 97, 98, and 99, which are arranged to guide the polishing tape 73 such that the polishing tape 73 travels in a direction perpendicular to a tangential direction of the substrate W.

The tape-sending mechanism 92 of the polishing head 80 includes a tape-sending roller 92a, a tape-holding roller 92b, and a motor M3 configured to rotate the tape-sending roller 92a. The motor M3 is mounted on a side surface of the polishing head 80. The tape-sending roller 92a is coupled to a rotational shaft of the motor M3. The polishing tape 73 is wound about half around the tape-sending roller 92a. The tape-holding roller 92b is located next to the tape-sending roller 92a. The tape-holding roller 92b is supported by a non-illustrated mechanism, which exerts a force on the tape-holding roller 92b in a direction indicated by NF in FIG. 15 (i.e., in a direction toward the tape-sending roller 92a) so as to press the tape-holding roller 92b against the tape-sending roller 92a.

As the motor M3 rotates in a direction indicated by arrow in FIG. 15, the tape-sending roller 92a is rotated to send the polishing tape 73 from the supply reel 74 to the recovery reel 75 via the polishing head 80. The tape-holding roller 92b is configured to rotate freely about its own axis and is rotated as the polishing tape 73 is sent by the tape-sending roller 92a.

The pressing mechanism 91 includes a press pad 100 arranged at the rear side of the polishing tape 73 and an air cylinder (an actuator) 102 configured to move the press pad 100 toward the substrate W. The air cylinder 102 is a so-called single rod cylinder. Pressure to press the polishing tape 73 against the substrate W is adjusted by air pressure supplied to the air cylinder 102.

As shown in FIG. 13, the polishing head 80 is secured to one end of an arm 110, which is rotatable about an axis Ct extending parallel to the tangential direction of the substrate W. The other end of the arm 110 is coupled to a motor M4 via pulleys p3 and p4 and a belt b2. As the motor M4 rotates in a clockwise direction and a counterclockwise direction through a predetermined angle, the arm 110 rotates about the axis Ct through a predetermined angle. In this embodiment, the motor M4, the arm 110, the pulleys p3 and p4, and the belt b2 constitute a tilting mechanism for tilting the polishing head 80. The tilt motion of the polishing head 80 is performed before polishing or during polishing. This tilt motion of the polishing head 80 enables the polishing tape 73 to polish not only the bevel portion but also the near-edge portions of the substrate W.

As shown in FIG. 14, the tilting mechanism is mounted on a movable base 111. This movable base 111 is movably coupled to a base plate 115 through guides 112 and rails 113. The rails 113 extend linearly in a radial direction of the substrate W held on the rotary holding mechanism 53, so that the movable base 111 can move linearly in the radial direction of the substrate W. A connection plate 116, extending through the base plate 115, is secured to the movable base 111. A linear actuator 117 is coupled to the connection plate 116 via a joint 118. This linear actuator 117 is secured to the base plate 115 directly or indirectly.

The linear actuator 117 may comprise an air cylinder or a combination of a positioning motor and a ball screw. The linear actuator 117, the rails 113, and the guides 112 constitute a moving mechanism for linearly moving the polishing head 80 in the radial direction of the substrate W. Specifically, the moving mechanism is operable to move the polishing head 80 along the rails 113 closer to and away from the substrate W. On the other hand, the tape supplying and recovering mechanism 52A is fixed to the base plate 115. The tilting mechanisms, the pressing mechanisms 91, and the tape-sending mechanisms 92 of the four polishing head assemblies 51A, 51B, 51C, and 51D arranged around the substrate W and the moving mechanisms for moving the respective polishing head assemblies are configured to operate independently of each other.

The polishing tape 73 has a base tape made from PET sheet or the like and a polishing layer formed on the base tape. The polishing layer comprises a binder (e.g., resin) covering one surface of the base tape and abrasive grains bound by the binder. A surface of the polishing layer provides the polishing surface.

Figure 16:
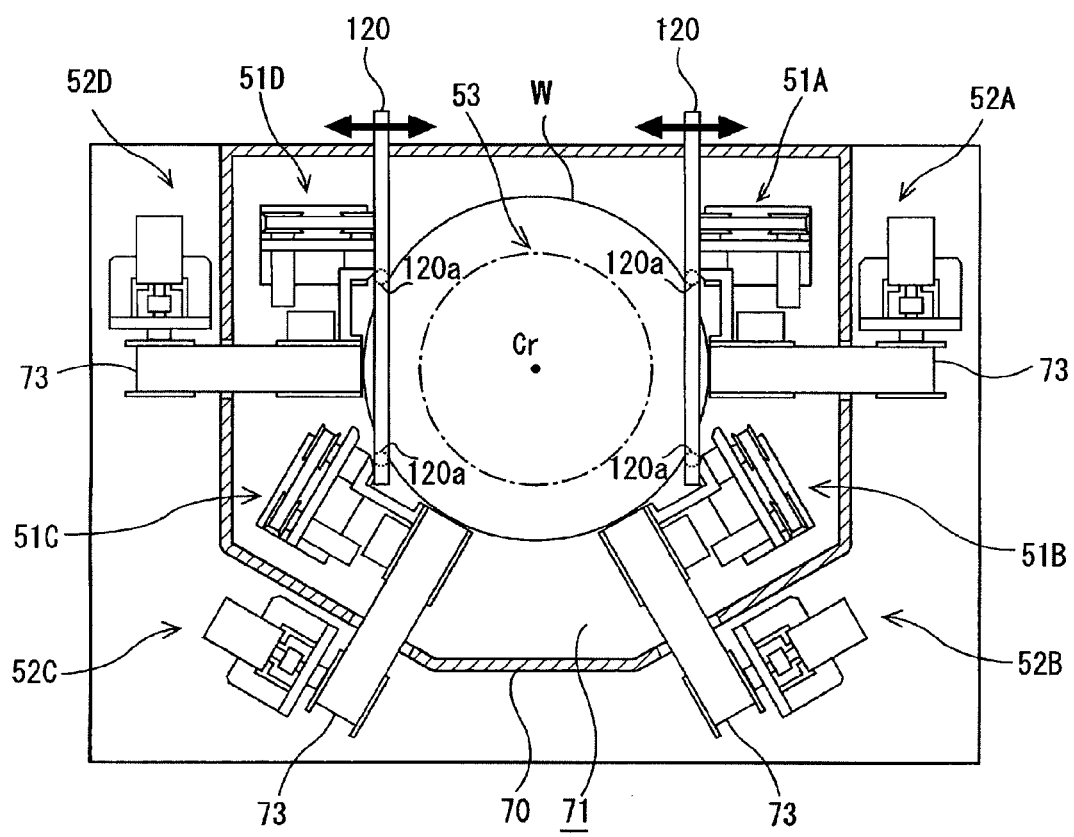
FIG. 16 is a plan view showing a manner of transporting a substrate by transfer arms.
Figure 17:
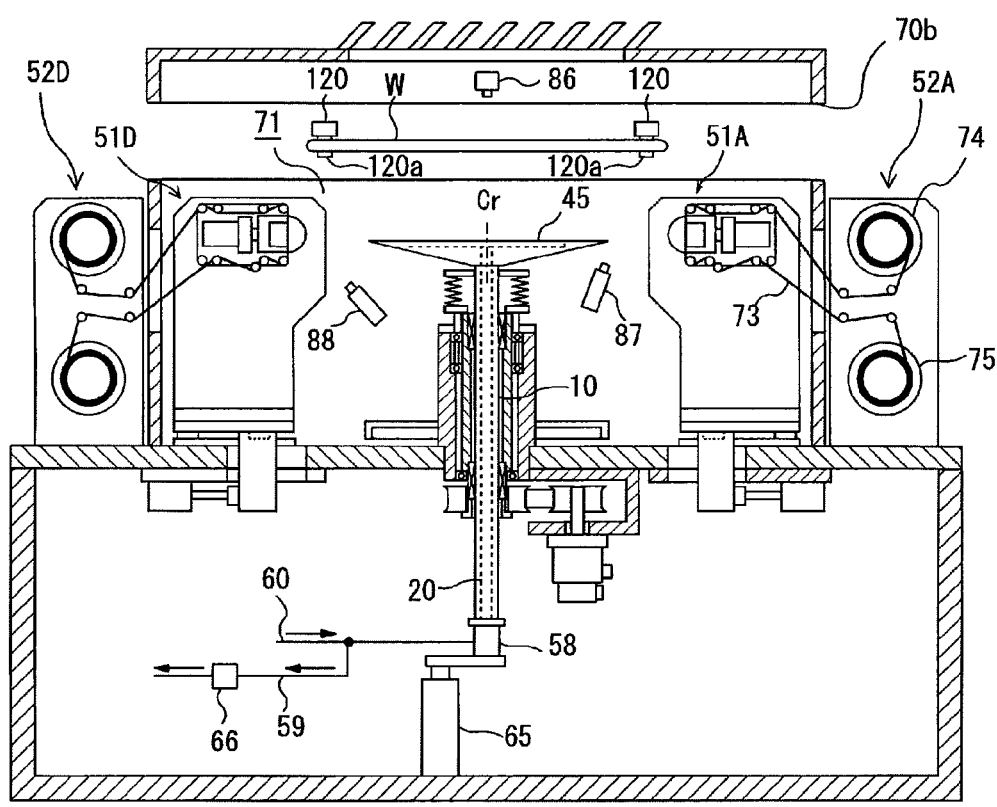
FIG. 17 is a cross-sectional view showing a manner of transporting the substrate by the transfer arms.

As shown in FIG. 16 and FIG. 17, the substrate W is transported into the polishing room 71 by two transfer arms 120 of the transfer device. Each of the transfer arms 120 has two claws 120a, and the substrate W is grasped by the four claws 120a. When the substrate W is transported to a position just above the substrate holder 45, the substrate holder 45 is elevated until its suction surface is brought into contact with the rear surface of the substrate and holds the substrate on the suction surface by the vacuum suction. The vacuum regulator 66 is operated so as to produce a relatively high vacuum when the substrate is attracted. After the substrate W is attracted, the transfer arms 120 are opened, and the substrate holder 45 is lowered. Then, the transfer arms 120 move to the exterior of the polishing room 71. In this manner, the substrate W is transferred from the transfer arms 120 to the substrate holder 45.

The degree of vacuum is increased when the substrate W is attracted. This is for the reason that the polishing apparatus is operated so as to polish the substrate W after holding the substrate W. In a case of carrying out a step of, for example, supplying a chemical liquid onto the surface of the substrate W prior to the polishing process, the degree of vacuum may be low when attracting the substrate and during supplying of the chemical liquid and the vacuum may be increased by the vacuum regulator 66 prior to the polishing process.

Figure 18A:
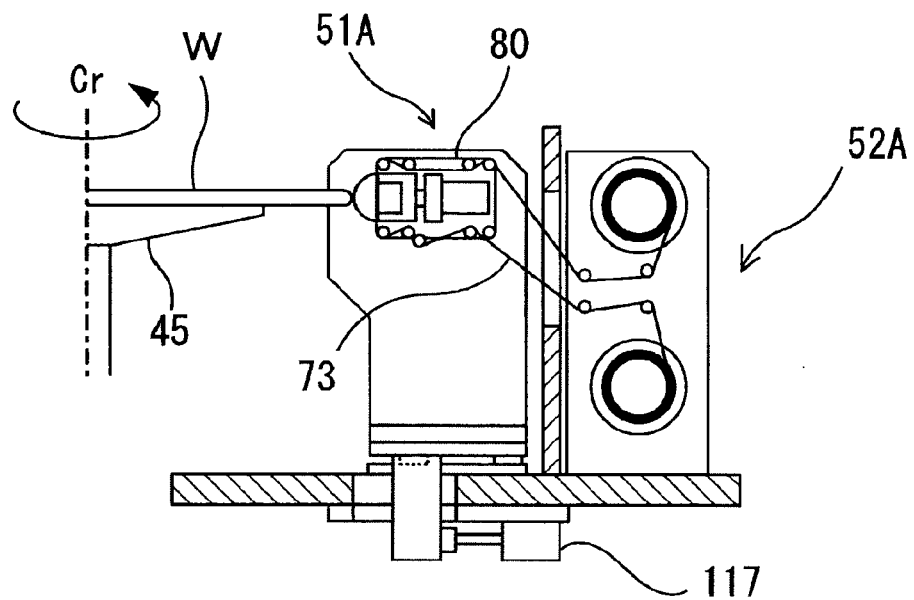
FIG. 18A is a view showing the substrate holder 45 in a lowered position while holding the substrate.
Figure 18B:
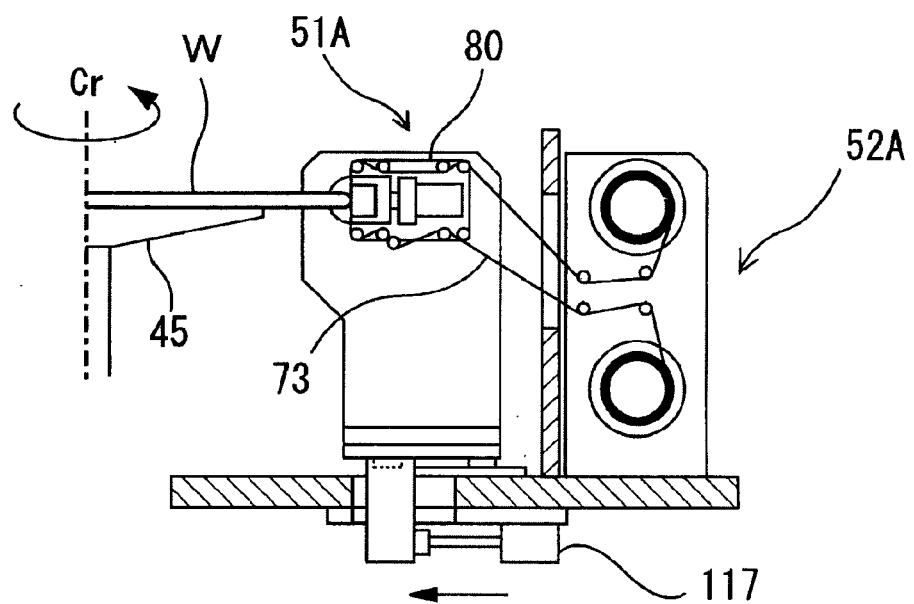
FIG. 18B is a view showing the polishing head that is moved toward the substrate and is polishing the substrate.

FIG. 18A is a view showing the substrate holder in a lowered position while holding the substrate, and FIG. 18B is a view showing the polishing head that is moved toward the substrate and is polishing the substrate. The polishing head 80 is moved from a retreat position shown in FIG. 18A to a polishing position shown in FIG. 18B and then presses the polishing tape 73 against the periphery of the substrate W to polish the periphery of the substrate W. During polishing, the periphery of the substrate W is subjected to a force from the polishing head 80. Therefore, it is necessary to increase the degree of vacuum to such a degree that the substrate W can be held against such external force.

Figure 19A:
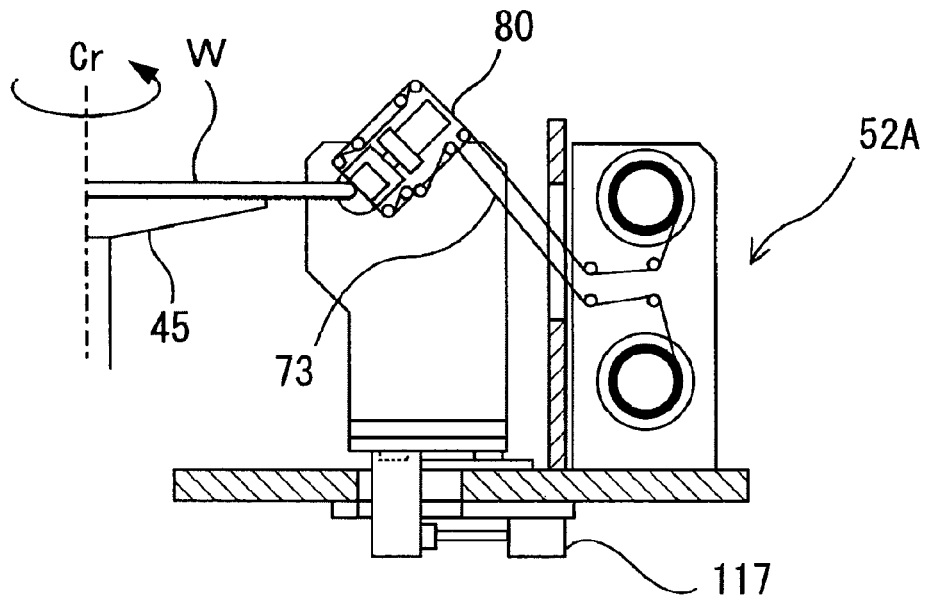
FIG. 19A is a view showing the polishing head polishing an upper region of a periphery of the substrate, with the polishing head inclined.
Figure 19B:
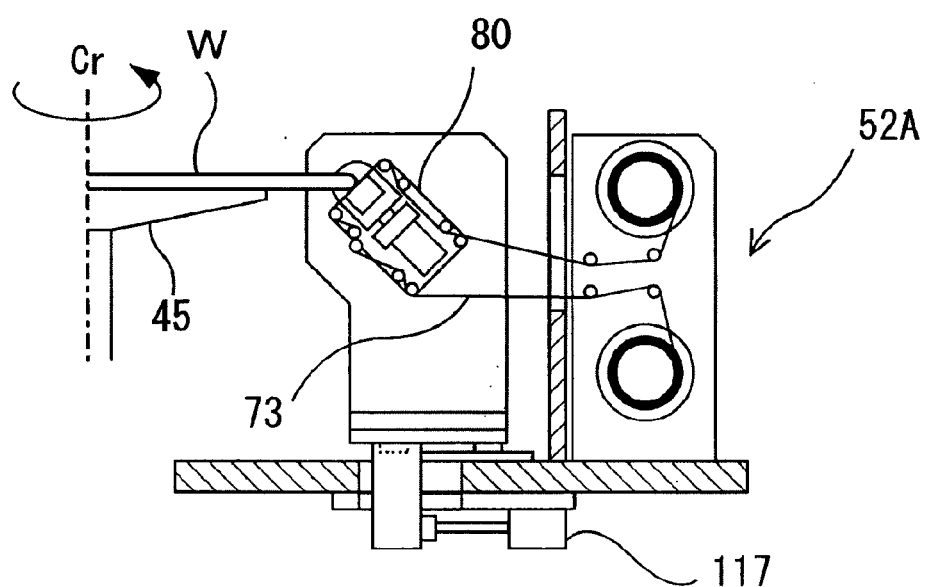
FIG. 19B is a view showing the polishing head polishing a lower region of the periphery of the substrate, with the polishing head inclined.

The polishing apparatus in this embodiment includes the tilting mechanism which is capable of changing an angle of the polishing head 80 with respect to the substrate W. As shown in FIGS. 19A and 19B, the polishing head 80 is tilted up and down with respect to the surface (i.e., the horizontal surface) of the substrate W so as to press the polishing tape 73 obliquely against the periphery of the substrate W, thus forming the periphery of the substrate W into a chamfered shape. During this polishing process, an external force is exerted on the substrate W from diagonally above as shown in FIG. 19A, and an external force is exerted on the substrate W from diagonally below as shown in FIG. 19B. In particular, the external force from diagonally below acts as a force of separating the substrate W from the substrate holder 45. Therefore, it is necessary to increase the degree of vacuum to such a degree that the substrate W can be held against such external force.

The polishing operation is terminated by separating the polishing head 80 from the substrate W. Thereafter, the degree of vacuum is lowered (to pressure close to atmospheric pressure) by the vacuum regulator 66, and water (preferably, pure water) is supplied to the substrate W from the nozzles 86 and 87 provided above and below the substrate W, while the substrate W is being rotated, to thereby rinse the substrate W so as to prevent the top and rear surfaces of the substrate W from being dried. When all of the processes are completed, the substrate holder 45 is elevated and the periphery of the substrate W is held by the transfer arms 120. Then, the tube 20 is coupled to the nitrogen-gas supply line 60, so that the nitrogen gas spouts from the vacuum production holes 14 toward the rear surface of the substrate W, whereby the substrate W is released from the substrate holder 45.

Figure 20:
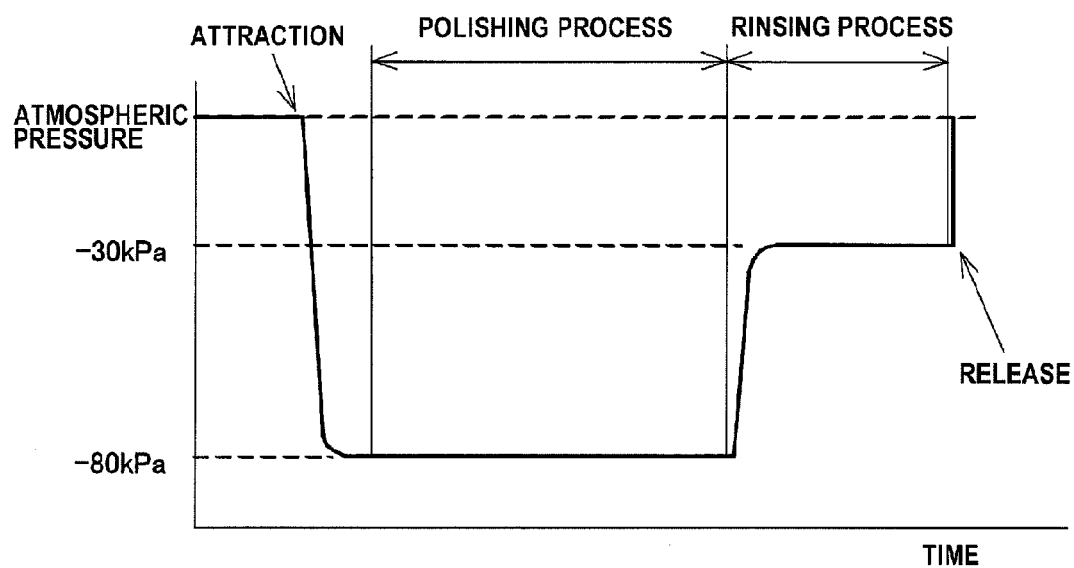
FIG. 20 is a graph showing degree of vacuum of the substrate holder during processing of the substrate.

FIG. 20 is a graph showing degree of vacuum [Pa] of the substrate holder during processing of the substrate. As shown in FIG. 20, when attracting and polishing the substrate, the degree of vacuum is kept high at −80 kPa. On the other hand, after the polishing process is terminated, the degree of vacuum is lowered to −30 kPa. In this state, the water is supplied to the surface of the substrate W to thereby rinse the substrate W. The vacuum is released before the substrate W is transferred to the exterior of the polishing apparatus and the nitrogen gas is ejected to blow the substrate W to thereby release it.

In this way, the degree of vacuum is increased when the external force acts on the substrate W, e.g., when the polishing process is performed, and on the other hand the degree of vacuum is lowered when the external force hardly acts on the substrate W, e.g., when the rinsing process is performed. Changing the vacuum suction force in this manner makes it easier to release the substrate W. This is because of the following reason. In a region where the suction pad is in contact with the substrate W, a foamed layer of the suction pad acts as a microscopic suction cup even after the vacuum is released to atmospheric pressure. Specifically, while the concavities are vented to atmospheric pressure, the convexities of the suction pad contacting the substrate W act as a suction cup, thus still attracting the substrate W. Thus, by reducing the degree of vacuum before releasing the substrate W, the holding force of the suction cup can be weakened. As a result, the substrate W can be released without stress. In this manner, combination of controlling the vacuum suction force for the substrate W and the substrate holder makes it possible to release the substrate W without putting stress on the substrate W.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate holder for holding a substrate by vacuum suction, said substrate holder comprising:
    a substrate-holding stage having a suction surface for the substrate; and
    a fluid passage selectively coupled to a vacuum source and a fluid supply source,
    wherein said suction surface has a plurality of closed sections surrounded by convexities,
    wherein said fluid passage includes a plurality of communication passages which are in fluid communication with said plurality of closed segments respectively and independently;
    said substrate-holding stage has a suction pad to be brought into contact with the substrate; and
    said convexities are formed by said suction pad.

2. The substrate holder according to claim 1, wherein said substrate-holding stage includes a plurality of support members having a height equal to that of said convexities, and said plurality of support members are arranged in said plurality of closed sections.

3. The substrate holder according to claim 1, wherein:
    said plurality of communication passages branch off from a single main passage; and
    flow-rate regulators for regulating a flow rate of fluid are provided in said plurality of communication passages.

4. The substrate holder according to claim 3, wherein said flow-rate regulators are orifices that provide resistance to flow of the fluid.

5. A substrate holder for holding a substrate by vacuum suction, said substrate holder comprising:
    a substrate-holding stage having a suction surface for the substrate; and
    a fluid passage selectively coupled to a vacuum source and a fluid supply source,
    wherein said suction surface has a plurality of closed sections surrounded by convexities,
    wherein said fluid passage includes a plurality of communication passages which are in fluid communication with said plurality of closed segments respectively and independently,
    wherein said substrate-holding stage has a sheet suction pad to be brought into contact with the substrate; and
    wherein said convexities and said closed sections are formed on a surface of said suction pad.

6. The substrate holder according to claim 1, wherein said suction surface is smaller than the substrate.

7. The substrate holder according to claim 5, wherein said substrate-holding stage includes a plurality of support members having a height equal to that of said convexities, and said plurality of support members are arranged in said plurality of closed sections.

8. The substrate holder according to claim 5, wherein:
    said plurality of communication passages branch off from a single main passage; and
    flow-rate regulators for regulating a flow rate of fluid are provided in said plurality of communication passages.

9. The substrate holder according to claim 8, wherein said flow-rate regulators are orifices that provide resistance to flow of the fluid.

10. The substrate holder according to claim 5, wherein said suction surface is smaller than the substrate.

* * * * *